United States Patent
Takechi

(10) Patent No.: US 6,579,749 B2
(45) Date of Patent: *Jun. 17, 2003

(54) FABRICATION METHOD AND FABRICATION APPARATUS FOR THIN FILM TRANSISTOR

(75) Inventor: Kazushige Takechi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/440,615

(22) Filed: Nov. 15, 1999

(65) Prior Publication Data

US 2002/0009836 A1 Jan. 24, 2002

(30) Foreign Application Priority Data

Nov. 17, 1998 (JP) .......................................... 10-326282

(51) Int. Cl.⁷ .............................................. H01L 21/00
(52) U.S. Cl. ........................ 438/149; 438/150; 438/151
(58) Field of Search ................................ 438/149, 150, 438/151, 152, 153; 257/66, 65, 60, 57; 430/315, 276, 278; 428/471, 620, 469

(56) References Cited

U.S. PATENT DOCUMENTS

| 4,842,892 A | * | 6/1989 | Smith et al. | 427/39 |
| 5,122,482 A | * | 6/1992 | Hayashi et al. | 437/225 |
| 5,620,924 A | * | 4/1997 | Takizawa et al. | 427/108 |
| 5,660,971 A | * | 8/1997 | Kobayashi et al. | 430/315 |
| 5,851,440 A | * | 12/1998 | Tanaka et al. | 257/66 |
| 5,864,149 A | * | 1/1999 | Yamamori | 257/59 |
| 5,900,646 A | * | 5/1999 | Takizawa et al. | 257/57 |
| 5,986,286 A | * | 11/1999 | Yamazaki et al. | 257/65 |
| 6,066,516 A | * | 5/2000 | Miyasaka | 438/149 |

FOREIGN PATENT DOCUMENTS

| JP | 55-34422 | | 3/1980 | |
| JP | 61-89670 | * | 5/1986 | 29/78 |
| JP | 62-280791 | | 12/1987 | |
| JP | 1-235383 | | 9/1989 | |
| JP | 2-163971 | | 6/1990 | |
| JP | 5-304171 | | 11/1993 | |
| JP | 6-151460 | | 5/1994 | |
| JP | 7-131023 | | 5/1995 | |
| JP | 9-223800 | | 8/1997 | |
| JP | 9-283767 | * | 10/1997 | 29/786 |
| JP | 9-331067 | | 12/1997 | |
| JP | 10-12882 | | 1/1998 | |
| JP | 10-98085 | | 4/1998 | |
| JP | 10-173195 | * | 6/1998 | 29/786 |

* cited by examiner

*Primary Examiner*—Carl Whitehead, Jr.
*Assistant Examiner*—Laura M Schillinger
(74) *Attorney, Agent, or Firm*—Scully, Scott, Murphy & Presser

(57) ABSTRACT

In a fabrication of a thin film transistor, an amorphous silicon film 4 is formed on a substrate 1 and, then, phosphor 6 is deposited or diffused on or into a surface of the amorphous silicon film 4 by exposing the amorphous silicon film to phosphine plasma 5. Thereafter, a metal film 7 for source and drain electrodes is formed by sputtering. Phosphor 6 diffuses to a surface layer of the amorphous silicon film 4 during this sputtering and an n-type amorphous silicon film 8 as an ohmic contact layer is formed automatically.

20 Claims, 4 Drawing Sheets

FABRICATION METHOD AND FABRICATION APPARATUS FOR THIN FILM TRANSISTOR

BACKGROUND OF THE INVENTION

1. Field of the Invention

The present invention relates to a fabrication method for fabricating a semiconductor device such as a thin film transistor and a fabrication apparatus therefor. Particularly, the present invention relates to a fabrication method for fabricating a thin film transistor for use in an active matrix type liquid crystal display and an apparatus for realizing the same method.

2. Description of the Related Art

Recently, the research and development of the thin film transistor used as a driving device for each of pixels of a liquid crystal flat panel display has been promoted remarkably. With the popularization of the note type personal computer, the demand of liquid crystal display is increased rapidly and, further, with the increased demand of the same for a large size monitor display, the improvement of productivity thereof and the improvement of performance thereof have been required.

The productivity of liquid crystal display depends upon the fabrication step of a thin film transistor substrate and one of important factors which determine the performance of high precision liquid crystal display is the performance of thin film transistor element. Therefore, it will become very important to fabricate a high performance thin film transistor with high productivity.

In the reverse-staggered type thin film transistor, a non-doped amorphous silicon is used as an active layer. An n-type amorphous silicon film is formed on the amorphous silicon film as an ohmic contact layer, and source and drain electrodes are provided thereon. In the conventional fabrication method of reverse-staggered type thin film transistor, the n-type amorphous silicon film is formed by using plasma CVD, mainly. For example, Japanese Patent Application Laid-open Nos. Hei 5-304171, Hei 9-223800 and Hei 10-12882 disclose method for fabricating the n-type amorphous silicon film by using plasma CVD.

The method disclosed in Japanese Patent Application Laid-open No. Hei 5-304171 will be described briefly as a general method of reverse-staggered type thin film transistor.

First, a metal film is formed on a transparent insulating substrate 1 and a gate electrode is formed by patterning the metal film to a desired shape. Thereafter, a silicon nitride film as a gate insulating film, an amorphous silicon film and an n-type amorphous silicon film are formed on the gate electrode in the order by plasma CVD, etc.

Then, the n-type amorphous silicon film and the amorphous silicon film are patterned to an island configuration. Further, after a metal film is formed on a whole surface of the wafer, the source and drain electrodes are formed by patterning the metal film.

Finally, unnecessary portion of the n-type amorphous silicon film on a channel is removed by etching, resulting in a reverse-staggered type thin film transistor.

In order to fabricate the thin film transistor with high yield, it is preferable to make the number of film forming steps as small as possible. If it is possible to fabricate a thin film transistor without separately forming the n-type amorphous silicon film, it becomes possible to improve the yield and reduce the fabrication cost.

A method for fabricating a reverse-staggered thin film transistor without separately forming an n-type amorphous silicon film is disclosed in Japanese Patent Application Laid-open No. Hei 2-163971. According to the disclosed method, the formation of the n-type amorphous silicon film becomes unnecessary by using a metal containing nickel phosphide for source and drain electrodes. Furthermore, the metal for the source and drain electrodes are formed by sputtering with using nickel phosphide and another metal or a mixture of them as a target material. It is described in the specification of Japanese Patent Application Laid-open No. Hei 2-163971 that measurements of characteristics of a thin film transistor fabricated according to the disclosed method is substantially the same as those of a thin film transistor having an n-type amorphous silicon film formed separately.

A method for continuously forming an amorphous silicon film, a gate insulating film and an aluminum film for forming a gate wiring on a substrate in vacuum is disclosed in Japanese Patent Application Laid-open No. Hei 9-331067.

However, according to the method disclosed in Japanese Patent Application Laid-open No. Hei 2-163971, a new problem that a resistance value of the source and drain electrodes is increased since phosphor is contained in the source and drain electrodes as an impurity.

Particularly, this problem becomes a source of signal delay in realizing a large size liquid crystal display and influences a displayed image adversely.

Further, according to the method disclosed in Japanese Patent Application Laid-open No. Hei 9-331067, in which the amorphous silicon film is formed as the lowest layer, it is necessary, in order to make the amorphous silicon film n type, to inject phosphor ions into the amorphous silicon film first. Therefore, it is very difficult to avoid the necessity of separately forming the n-type amorphous silicon film.

SUMMARY OF THE INVENTION

An object of the present invention is to provide a method for fabricating a thin film transistor having the source and drain electrodes free from phosphor impurity, without necessity of separately forming an n-type amorphous silicon film, and an apparatus for performing the same method.

According to the first aspect of the present invention, the object can be achieved by a method for fabricating a semiconductor device such as a thin film transistor, which comprises the first step of forming an amorphous silicon film on a substrate, the second step of performing a plasma processing with respect to a substrate having the amorphous silicon film formed thereon and the third step of forming a metal film on the amorphous silicon film while keeping the reduced pressure condition. The plasma processing contains an n-type impurity element selected from a group V of a periodic table to provide an n-type region in the top surface of the amorphous silicon film. For example, a phosphine plasma processing is performed under a reduced pressure condition.

According to this method, an impurity element of the group V such as a phosphor is either deposited on a surface of the amorphous silicon film or diffused into the surface thereof in the second step. Thereafter, when the metal film is formed in the third step, the phosphor further diffuses into a surface portion of the amorphous silicon film, so that an n-type amorphous silicon film is automatically formed between the metal film and the amorphous silicon film. That is, according to the present method, the metal film for forming the source and drain electrodes is free from the above mentioned impurity such as the phosphor impurity and it is unnecessary to form an n-type amorphous silicon film separately.

According to the second aspect of the present invention, the object can be achieved by a method for fabricating a semiconductor device, which comprises the first step of forming an amorphous silicon film on a substrate under a reduced pressure condition, the second step of performing a phosphine plasma processing with respect to the substrate without exposing the substrate to an oxidizing atmosphere and the third step of forming a metal film on the amorphous silicon film. Preferably, at least two adjacent steps are successively performed without exposing the substrate to the oxidizing atmosphere.

According to this semiconductor fabricating method, it is possible to obtain a similar effect to that obtained by the thin film transistor fabrication method mentioned previously. Especially, a cleaner interface can be achieved by performing each process without exposing the substrate to the oxidizing atmosphere.

According to the third aspect of the present invention, the object can be achieved by a method for fabricating a semiconductor device, which comprises the first step of forming an insulating film and an amorphous silicon film covering a gate electrode formed on a substrate, sequentially, the second step of patterning the amorphous silicon film, the third step of depositing phosphor on a surface of the amorphous silicon film by exposing the substrate to phosphine plasma under a reduced pressure condition and the fourth step of forming a metal film covering the amorphous silicon film while keeping the reduced pressure condition.

A similar effect to that obtained by the previously mentioned method according to the first or second aspect of the present invention can be obtained by this method.

According to the fourth aspect of the present invention, the object can be achieved by a method for fabricating a semiconductor device, which comprises the first step of forming an insulating film and an amorphous silicon film covering a gate electrode formed on a substrate, sequentially, the second step of depositing phosphor on a surface of the amorphous silicon film by exposing the substrate to phosphine plasma under a reduced pressure condition, the third step of forming a metal film on the amorphous silicon film while keeping the reduced pressure condition and the fourth step of patterning the metal film.

A similar effect to that obtained by the method according to the second aspect of the present invention can be obtained by this method.

In the former method according to the third aspect of the present invention, the phosphine plasma processing and the metal film formation are executed after the amorphous silicon film is patterned to a desired island configuration, for example. However, according to the latter method according to the fourth aspect of the present invention, it is possible to pattern the metal film and the amorphous silicon film to a desired island configuration after the formation of the amorphous silicon film, the phosphine plasma processing and the formation of the metal film are performed continuously.

These methods may further comprise the fifth step of removing unnecessary portion of the amorphous silicon film between the source and drain electrodes.

The fifth step may be performed simultaneously with the fourth step when the metal film is patterned by either one of dry etching or wet etching.

That is, by dry or wet etching the metal film from which the source and drain electrodes are formed, it is possible to remove unnecessary portion of a very thin n-type amorphous silicon film, that is, an ohmic contact layer. Thus, the step for removing or reforming the unnecessary portion of the n-type amorphous silicon film, such as an etching step or a plasma processing step, can be removed.

Alternatively, it is possible to convert the unnecessary portion of the amorphous silicon film between the source and drain electrodes into an insulating film by performing a plasma processing for the unnecessary portion.

According to the sixth aspect of the present invention, the object can be achieved by a semiconductor fabrication apparatus capable of successively performing an exposition of an amorphous silicon film formed on a substrate to phosphine plasma and a formation of a metal film on the amorphous silicon film while keeping a reduced pressure condition.

According to the seventh aspect of the present invention, the object can be achieved by a semiconductor fabrication apparatus capable of continuously performing a formation of an amorphous silicon film on a substrate, an exposition of the amorphous silicon film to phosphine plasma and a formation of a metal film on the amorphous silicon film while keeping a reduced pressure condition.

According to the eighth aspect of the present invention, the object can be achieved by a semiconductor fabrication apparatus comprising the first chamber for exposing a substrate to phosphine plasma, the second chamber for forming a metal film on the substrate and a gate valve for connecting the first chamber to the second chamber while keeping a reduced pressure condition.

According to the ninth aspect of the present invention, the object can be achieved by a semiconductor fabrication apparatus comprising the first chamber for heating a substrate, the second chamber for exposing the substrate to phosphine plasma, the third chamber for forming a metal film on the substrate, the first gate valve for connecting the first chamber to the second chamber while keeping a reduced pressure condition and the second gate valve for connecting the second chamber to the third chamber while keeping the reduced pressure condition.

According to the tenth aspect of the present invention, the object can be achieved by a semiconductor fabrication apparatus comprising the first chamber for heating a substrate, the second chamber for exposing the substrate to phosphine plasma, the third chamber for forming a metal film on the substrate, the fourth chamber functioning as a space for transporting the substrate, the first gate valve for connecting the first chamber to the fourth chamber while keeping a reduced pressure condition, the second gate valve for connecting the second chamber to the fourth chamber while keeping the reduced pressure condition and the third gate valve for connecting the third chamber to the fourth chamber while keeping the reduced pressure condition.

According to the eleventh aspect of the present invention, the object can be achieved by a semiconductor fabrication apparatus comprising the first chamber for heating a substrate, the second chamber for forming a gate insulating film on the substrate, the third chamber for forming an amorphous silicon film on the substrate, the fourth chamber for exposing the substrate to phosphine plasma, the fifth chamber for forming a metal film on the substrate, the first gate valve for connecting the first chamber to the second chamber while keeping a reduced pressure condition, the second gate valve for connecting the second chamber to the third chamber while keeping the reduced pressure condition, the third gate valve for connecting the third chamber to the fourth chamber while keeping the reduced pressure condition and the fourth gate valve for connecting the fourth chamber to the fifth chamber while keeping the reduced pressure condition.

According to the twelfth aspect of the present invention, the object can be achieved by a semiconductor fabrication apparatus comprising the first chamber for heating a substrate, the second chamber for forming a gate insulating film on the substrate, the third chamber for forming an amorphous silicon film on the substrate, the fourth chamber for exposing the substrate to phosphine plasma, the fifth chamber for forming a metal film on the substrate, the sixth chamber functioning as a space for transporting the substrate, the first gate valve for connecting the first chamber to the sixth chamber while keeping a reduced pressure condition, the second gate valve for connecting the second chamber to the sixth chamber while keeping the reduced pressure condition, the third gate valve for connecting the third chamber to the sixth chamber while keeping the reduced pressure condition, the fourth gate valve for connecting the fourth chamber to the sixth chamber while keeping the reduced pressure condition and the fifth gate valve for connecting the fifth chamber to the sixth chamber while keeping the reduced pressure condition.

The previously mentioned methods for fabricating semiconductor devices can be performed by the above mentioned semiconductor device fabrication apparatuses.

BRIEF DESCRIPTION OF THE DRAWINGS

This above mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

Figure 1A:
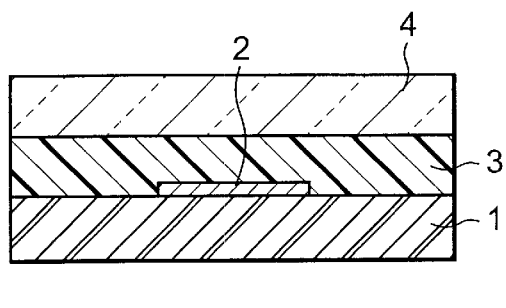
FIGS. 1A to 1E are cross sections of a semiconductor device, showing fabrication steps of the first embodiment of a thin film transistor fabrication method according to the present invention.

A method for fabricating a semiconductor device according to an embodiment of the present invention will be described with reference to FIGS. 1A to 1E. First, as shown in FIG. 1A, a gate electrode 2 is formed by patterning a metal film formed on a transparent insulating substrate 1 to a desired shape. Then, a gate insulating film 3 and an amorphous silicon film 4 are formed in the order on the transparent insulating substrate 1 by plasma CVD, etc.

Figure 1D:
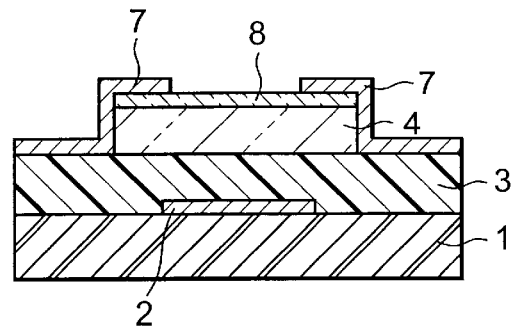
Figure 1B:
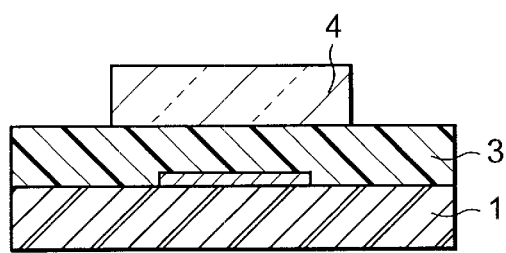

Thereafter, the amorphous silicon film 4 is patterned to a desired island configuration as shown in FIG. 1B.

Figure 1E:
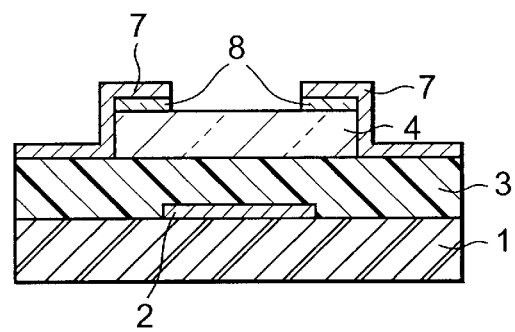
Figure 1C:
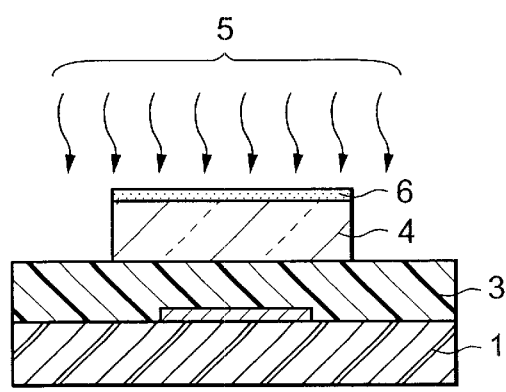

Then, as shown in FIG. 1C, phosphor 6 is deposited on a surface of the amorphous silicon film 4 by exposing the transparent insulating substrate 1 to phosphine plasma 5. At this process, phosphor may diffuse into a surface layer portion of the amorphous silicon film 4.

Thereafter, a metal film for the source and drain electrodes is formed on the substrate 1 and the amorphous silicon film 4 by sputtering, etc., and then, the source and drain electrodes 7 is formed by patterning the metal film to a desired shape, as shown in FIG. 1D.

Even in this sputtering process, the phosphor 6 diffuses into the surface layer portion of the amorphous silicon film 4 so that an n-type amorphous silicon layer 8 is automatically formed as an ohmic contact layer.

It is also possible to successively perform the phosphine plasma processing (FIG. 1C) and the formation of the metal film for the source and drain electrodes by sputtering (FIG. 1D) without breaking the reduced pressure condition. When the substrate 1 is put in atmospheric condition temporarily after the phosphine plasma processing and, then, the film for the source and drain electrodes is formed by sputtering under vacuum condition, it is also possible to obtain an acceptable ohmic contact characteristics. In the case of successive processing without breaking the reduced pressure condition, the increase of the throughput of the processes can be expected.

Finally, an unnecessary portion of the n-type amorphous silicon film between the source and drain electrodes is removed by etching, resulting in a thin film transistor, as shown in FIG. 1E.

In the foregoing embodiment, it is possible to remove the unnecessary portion of the n-type amorphous silicon film at the etching process of the metal film shown in FIG. 1D. That is, two processes shown in FIG. 1D and FIG. 1E are carried out at one process. This is because the thickness of the automatically formed n-type amorphous silicon layer 8 is very thin and thus additional etching process for the unnecessary portion of the n-type amorphous silicon film is not necessary.

In the first embodiment mentioned above, the phosphine plasma processing (FIG. 1C) and the formation of the metal film by sputtering (FIG. 1D) are performed successively after the amorphous silicon film 4 is patterned to the desired island configuration. However, it is possible to pattern the amorphous silicon film 4 to the island configuration after the phosphine plasma. A second embodiment of the present invention is featured by the latter method.

Now, a method for fabricating a semiconductor device according to the second embodiment will be described with reference to FIGS. 2A to 2E.

Figure 2A:
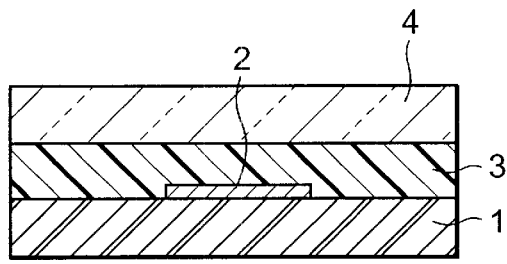
FIGS. 2A to 2E are cross sections of a semiconductor device, showing fabrication steps of the second embodiment of a thin film transistor fabrication method according to the present invention.

First, as shown in FIG. 2A, a gate electrode 2 is formed by patterning a metal film formed on a transparent insulating substrate 1 to a desired shape.

Then, a gate insulating film 3 and an amorphous silicon film 4 are formed in the order on the transparent insulating substrate 1 by plasma CVD, etc.

Figure 2D:
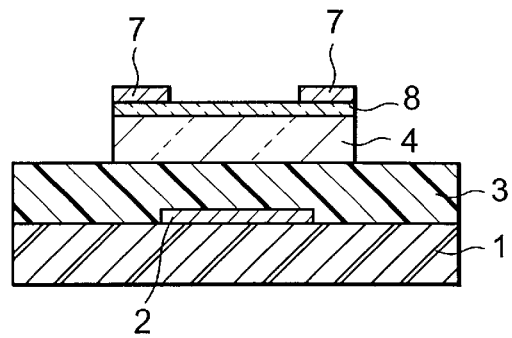
Figure 2B:
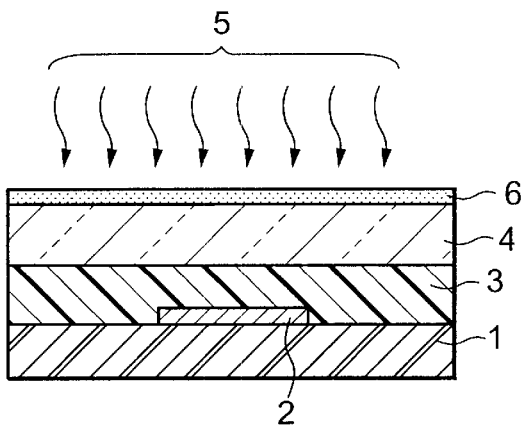

Then, as shown in FIG. 2B, phosphor 6 is deposited on a surface of the amorphous silicon film 4 by exposing the transparent insulating substrate 1 to phosphine plasma 5. At this process, phosphor may diffuse into a surface layer portion of the amorphous silicon film 4.

Figure 2E:
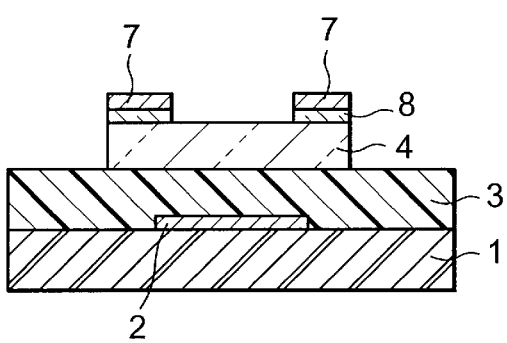
Figure 2C:
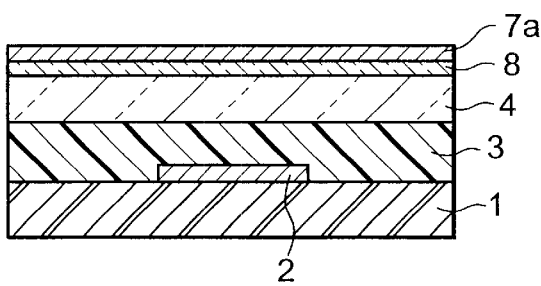

After the phosphine plasma processing, a metal film 7a for the source and drain electrodes is formed by sputtering, as shown in FIG. 2C.

Even in this sputtering process, phosphor 6 diffuses to the surface layer portion of the amorphous silicon film and an n-type amorphous silicon film 8 is automatically formed.

The foregoing four processes, that is, the formation of the gate insulating film 3, the formation of the amorphous silicon film 4, the phosphine plasma processing and the formation of the metal film 7a can be performed successively without exposing the substrate to an oxidizing atmosphere to increase a through-put of the processes. Even if the substrate is exposed to the atmosphere among the four processes, the characteristics of the finished thin film transistor show the similar characteristics.

Thereafter, as shown in FIG. 2D, the metal film 7a is patterned to desired source and drain electrodes and the n-type amorphous silicon film 8 and the amorphous silicon film 4 are patterned to a desired island configuration.

Finally, an unnecessary portion of the n-type amorphous silicon film is removed by etching, resulting in a thin film transistor, as shown in FIG. 2E.

In the foregoing second embodiment, it is also possible to remove the unnecessary portion of the n-type amorphous silicon film at the etching process of the metal film shown in FIG. 2D. That is, two processes shown in FIG. 2D and FIG. 2E are carried out at one process. This is because the thickness of the automatically formed n-type amorphous silicon layer 8 is very thin and thus additional etching process for the unnecessary portion of the n-type amorphous silicon film is not necessary.

As mentioned, according to the second embodiment, it is possible to fabricate a reverse-staggered thin film transistor without forming the n-type amorphous silicon film separately.

In the first embodiment, it is necessary to continuously perform the phosphine plasma processing and the formation of the metal film by sputtering. A third embodiment of the present invention is an apparatus for performing the method according to the first embodiment.

Figure 3A:
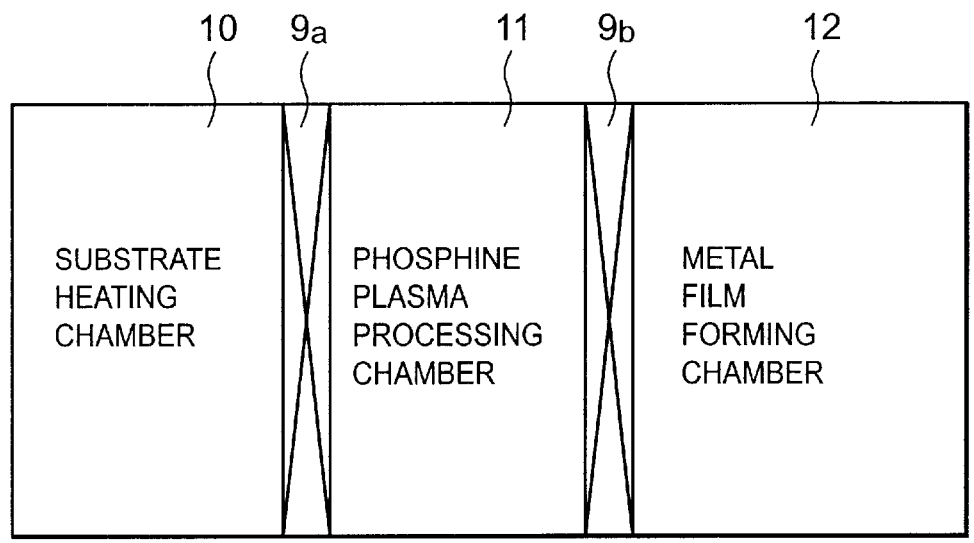
FIGS. 3A and 3B show an embodiment of a semiconductor fabrication apparatus according to the present invention.

FIG. 3A shows the first example of the apparatus for fabricating a semiconductor device, according to the third embodiment.

In FIG. 3A, the apparatus includes a substrate heating chamber 10 as the first chamber for heating a substrate, a phosphine plasma processing chamber 11 as the second chamber for exposing the heated substrate to phosphine plasma, a metal film forming chamber 12 as the third chamber for forming a metal film for the source and drain electrodes on the substrate, the first gate valve 9a for connecting the substrate heating chamber 10 to the phosphine plasma processing chamber 11 while keeping a reduced pressure condition so as not to expose said substrate to an oxidizing atmosphere and the second gate valve 9b for connecting the phosphine plasma processing chamber 11 to the metal film forming chamber 12 while keeping the reduced pressure condition.

In this apparatus, the substrate is heated in the substrate heating chamber 11, transported to the phosphine plasma processing chamber 11 and exposed to phosphine plasma therein. The substrate is then transported to the metal film forming chamber 12 and the metal film for the source and drain electrodes is formed on the substrate.

The transportation of the substrate from the substrate heating chamber 10 through the phosphine plasma processing chamber 11 to the metal film forming chamber 12 is performed under the reduced pressure condition which is kept by the first and second gate valves 9a and 9b.

It should be noted that the substrate heating chamber 10 is not always necessary in the third embodiment shown FIG. 3A. The substrate may be heated by other means than the substrate heating chamber 10 and transported into the phosphine plasma processing chamber 11.

Figure 3B:
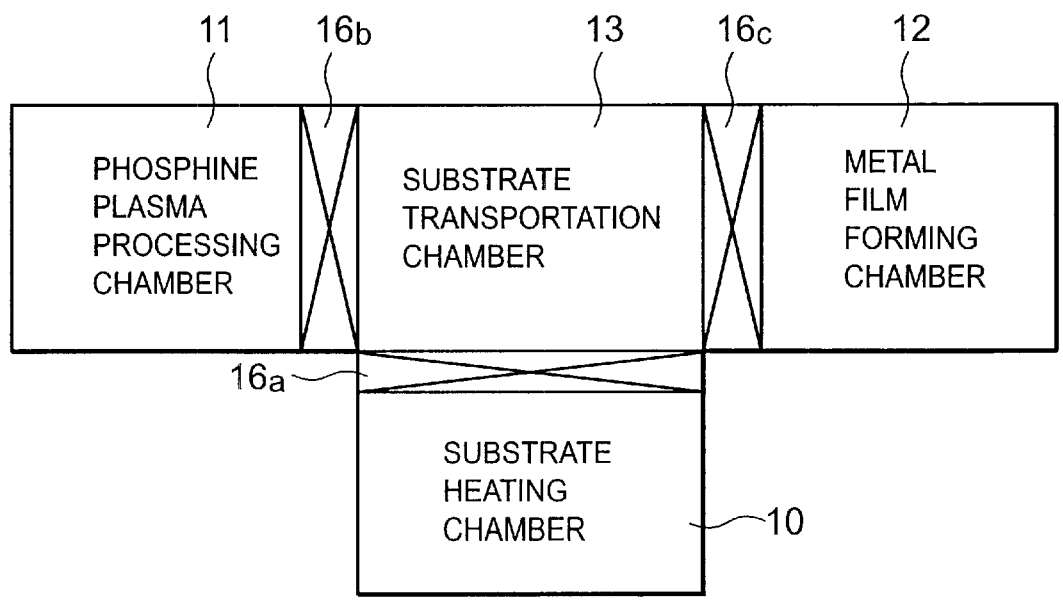

The first example shown in FIG. 3A is a batch type apparatus. FIG. 3B shows the second example of the third embodiment of the present invention, which is a sheet fed type apparatus.

In FIG. 3B, the apparatus includes a substrate heating chamber 10 as the first chamber for heating a substrate, a phosphine plasma processing chamber 11 as the second chamber for exposing the heated substrate to phosphine plasma, a metal film forming chamber 12 as the third chamber for forming a metal film for the source and drain electrodes on the substrate, a substrate transportation chamber 13 as the fourth chamber functioning as a space for transporting the substrate from the substrate heating chamber 10 through the phosphine plasma processing chamber 11 to the metal film forming chamber 12, the first gate valve 16a for connecting the substrate heating chamber 10 to the substrate transportation chamber 13 while keeping a reduced pressure condition, the second gate valve 16b for connecting the phosphine plasma processing chamber 11 to the substrate transportation chamber 13 while keeping the reduced pressure condition and the third gate valve 16c for connecting the metal film forming chamber 12 to the substrate transportation chamber 13 while keeping the reduced pressure condition.

This apparatus is used in a manner to be described below.

The substrate is heated in the substrate heating chamber 10, transported to the phosphine plasma processing chamber 11 and exposed to phosphine plasma therein.

The substrate is then transported through the substrate transportation chamber 13 to the metal film forming chamber 12 while keeping the reduced pressure condition and the metal film for the source and drain electrodes is formed therein.

The transportation of the substrate between the substrate heating chamber 10, the phosphine plasma processing chamber 11, the metal film forming chamber 12 and the substrate transportation chamber 13 is performed under the reduced pressure condition which is kept by the first, second and third gate valves 16a, 16b and 16c.

The substrate heating chamber 10 shown in FIG. 3A or 3B has a usual structure suitable to heat the substrate and is composed of, for example, a heater and a vacuum pump, etc.

The substrate transportation chamber 13 has a usual structure suitable to transport the substrate between the respective chambers and is composed of, for example, a substrate transportation arm and a vacuum pump, etc.

The phosphine plasma processing chamber 11 has a structure suitable to perform the phosphine plasma processing shown in FIG. 1C and is composed of, for example, a vacuum pump, an inlet of phosphine gas, a substrate heater and electrode plates for applying RF voltage, etc. The structure of the phosphine plasma processing chamber 11 may be similar to that of a conventional plasma CVD chamber.

The metal film forming chamber 12 has a structure suitable to form the metal film for the source and drain electrodes shown in FIG. 1D and is composed of, for example, a vacuum pump, an inlet of sputtering gas such as argon, a substrate heater and a metal target to which a DC voltage is applied, etc. The structure of the metal film forming chamber 12 may be substantially the same as that of a conventional DC sputtering device.

Furthermore, the chamber 12 is not limited to such sputtering device but may have the device structure of those similar to the conventional vapor deposition device.

In the method according to the second embodiment of the present invention, it is necessary to successively perform the formation of the gate insulating film, the formation of the amorphous silicon film, the phosphine plasma processing and the formation of the metal film by sputtering, while keeping the reduced pressure condition so as not to expose said substrate to an oxidizing atmosphere. The fourth embodiment of the present invention is an apparatus for performing the method according to the second embodiment.

Figure 4A:
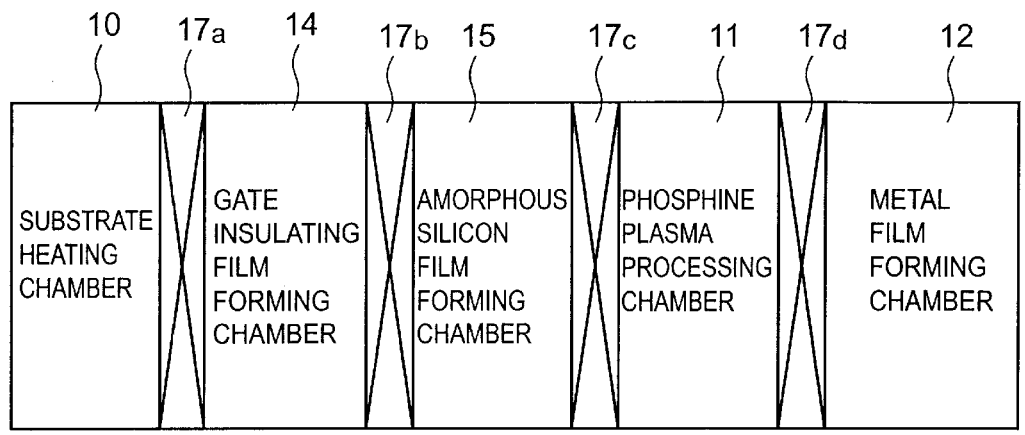
FIGS. 4A and 4B show another embodiment of a semiconductor fabrication apparatus according to the present invention.

FIG. 4A shows the first example of the apparatus for fabricating a semiconductor device, according to the fourth embodiment.

In FIG. 4A, the apparatus includes a substrate heating chamber 10 as the first chamber for heating a substrate, a gate insulating film forming chamber 14 as the second chamber for forming a gate insulating film on the substrate, an amorphous silicon film forming chamber 15 as the third chamber for forming the amorphous silicon film on the substrate, a phosphine plasma processing chamber 11 as the fourth chamber for exposing the substrate to phosphine plasma, a metal film forming chamber 12 as the fifth chamber for forming a metal film for the source and drain electrodes on the substrate, the first gate valve 17a for connecting the substrate heating chamber 10 to the gate insulating film forming chamber 14 while keeping a reduced pressure condition, the second gate valve 17b for connecting the gate insulating film forming chamber 14 to the amorphous silicon film forming chamber 15 while keeping the reduced pressure condition, the third gate valve 17c for connecting the amorphous silicon film forming chamber 15 to the phosphine plasma processing chamber 11 while keeping the reduced pressure condition and the fourth gate valve 17d for connecting the phosphine plasma processing chamber 11 to the metal film forming chamber 12 while keeping the reduced pressure condition.

In this apparatus, the substrate is heated in the substrate heating chamber 10 and, then, transported to the gate insulating film forming chamber 14 to form the gate insulating film thereon. Then, the substrate is transported to the amorphous silicon film forming chamber 15 to form the amorphous silicon film on the gate insulating film. Thereafter, the substrate is transported to the phosphine plasma processing chamber 11 and exposed to phosphine plasma therein. Further, the substrate is transported to the metal film forming chamber 12 to form the metal film for the source and drain electrodes thereon.

The transportation of the substrate between the substrate heating chamber 10, the gate insulating film forming chamber 14, the amorphous silicon film forming chamber 15, the phosphine plasma processing chamber 11 and the metal film forming chamber 12 is performed under the reduced pressure condition which is kept by the first, second, third and fourth gate valves 17a to 17d.

It should be noted that the substrate heating chamber 10 is not always necessary in the first example of the third embodiment shown FIG. 4A. The substrate may be heated by other means than the substrate heating chamber 10 and transported into the gate insulating film forming chamber 14.

Figure 4B:
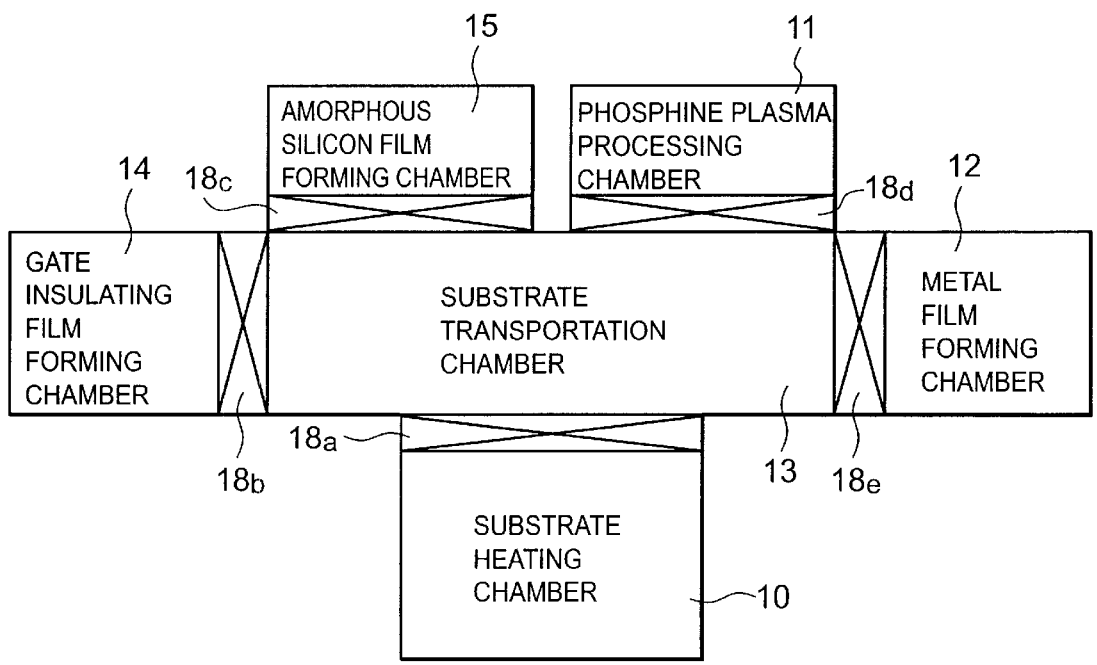

The first example shown in FIG. 4A is a batch type apparatus. FIG. 4B shows the second example of the fourth embodiment of the present invention, which is a sheet fed type apparatus.

In FIG. 4B, the apparatus includes a substrate heating chamber 10 as the first chamber for heating a substrate, a gate insulating film forming chamber 14 as the second chamber for forming a gate insulating film on the substrate, an amorphous silicon film forming chamber 15 as the third chamber for forming an amorphous silicon film on the substrate, a phosphine plasma processing chamber 11 as the fourth chamber for exposing the substrate to phosphine plasma, a metal film forming chamber 12 as the fifth chamber for forming a metal film for the source and drain electrodes on the substrate, a substrate transportation chamber 13 as the sixth chamber functioning as a space for transporting the substrate between the respective chambers 10, 14, 15, 11 and 12, the first gate valve 18a for connecting the substrate heating chamber 10 to the substrate transportation chamber 13 while keeping a reduced pressure condition, the second gate valve 18b for connecting the gate insulating film forming chamber 14 to the substrate transportation chamber 13 while keeping the reduced pressure condition, the third gate valve 18c for connecting the amorphous silicon film forming chamber 15 to the substrate transportation chamber 13 while keeping the reduced pressure condition, the fourth gate valve 18d for connecting the phosphine plasma processing chamber 11 to the substrate transportation chamber 13 while keeping the reduced pressure condition and the fifth gate valve 18e for connecting the metal film forming chamber 12 to the substrate transportation chamber 13 while keeping the reduced pressure condition. This apparatus is used as below.

First, the substrate is heated in the substrate heating chamber 10 and, then, transported through the substrate transportation chamber 13 to the gate insulating film forming chamber 14 in which the gate insulating film is formed on the substrate.

Thereafter, the substrate is transported to the amorphous silicon film forming chamber 15 through the substrate transportation chamber 13 again to form the amorphous silicon film on the substrate, while keeping the reduced pressure condition.

Then, the substrate is transported to the phosphine plasma processing chamber 11 through the substrate transportation chamber 13 again to perform the phosphine plasma processing to the substrate, while keeping the reduced pressure condition.

Finally, the substrate is transported to the metal film forming chamber 12 through the substrate transportation chamber 13 again to form the metal film for the source and drain electrodes thereon while keeping the reduced pressure condition.

The first to fifth gate valves 18a to 18e keep the reduced pressure condition during the transportation of the substrate between the substrate heating chamber 10, the gate insulating film forming chamber 14, the amorphous silicon film forming chamber 15, the phosphine plasma processing chamber 11, the metal film forming chamber 12 and the substrate transportation chamber 13.

The substrate heating chamber 10 shown in FIG. 4A or 4B has a usual structure suitable to heat the substrate and is composed of, for example, a heater and a vacuum pump, etc.

The substrate transportation chamber 13 has a usual structure suitable to transport the substrate between the respective chambers and is composed of, for example, a substrate transportation arm and a vacuum pump, etc.

The phosphine plasma processing chamber 11 has a structure suitable to perform the phosphine plasma processing shown in FIG. 1C and is composed of, for example, a vacuum pump, an inlet of phosphine gas, a substrate heater and electrode plates for applying RF voltage, etc. The structure of the phosphine plasma processing chamber 11 is similar to that of a conventional plasma CVD chamber.

The metal film forming chamber 12 has a structure suitable to form the metal film for the source and drain electrodes shown in FIG. 1D and is composed of, for example, a vacuum pump, an inlet of sputtering gas such as argon, a substrate heater and a metal target to which a DC voltage is applied, etc. The structure of the metal film forming chamber 12 is substantially the same as that of a conventional DC sputtering device.

Further, the gate insulating film forming chamber 14 and the amorphous silicon film forming chamber 15 have structures substantially the same as that of the conventional plasma CVD chamber, respectively.

Embodiment

The present invention will be described in detail with reference to the preferred embodiments. However, it should be noted that the present invention is not limited thereto.

As the first embodiment of the present invention, a method for fabricating a reverse-staggered type thin film transistor through the steps shown in FIGS. 1A to 1E will be described.

First, a 100 nm thick, metal film of chromium was formed on a whole surface of a substrate 1 formed of a transparent insulating glass material by sputtering and a gate electrode 2 was formed by patterning the metal film to a desired shape by using wet etching.

Then, the substrate 1 was heated to 300° C. and, on the heated substrate 1, a 400 nm thick, silicon nitride film 3 was formed as a gate insulating film by plasma CVD with using a mixture gas of silane, ammonia and nitrogen as a material and, on the gate insulating film 3, a 100 nm thick, amorphous silicon film 4 was formed as an active layer by plasma CVD with using a mixture gas of silane and hydrogen as a material, as shown in FIG. 1A.

Thereafter, the amorphous silicon film 4 was patterned to a desired island configuration by dry etching, as shown in FIG. 1B.

Then, phosphine plasma processing was performed for the amorphous silicon film 4 on the substrate 1 which was kept at 250° C. by using the phosphine plasma processing chamber 11 of the fabrication apparatus shown in FIG. 3A or 3B to deposit phosphor 6 on the surface portion of the amorphous silicon film 4 as shown in FIG. 1C. Argon based 0.5% phosphine gas was used as a material gas in the phosphine plasma processing.

Further, the glass substrate 1 was transported into the metal film forming chamber 12 and a chromium film 100 nm thick for the source and drain electrodes was formed on the substrate 1 kept at 250° C. while keeping a reduced pressure condition.

Thereafter, the chromium film was patterned to a desired shape to form the source and drain electrodes 7, as shown in FIG. 1D.

Finally, an unnecessary portion of the n-type amorphous silicon film between the source and drain electrodes was removed by etching, resulting in the thin film transistor shown in FIG. 1E.

The n-type amorphous silicon film formed by this embodiment is as thin as in the order of several nanometers. Therefore, it may be possible to fabricate the thin film transistor by converting the unnecessary portion of the n-type amorphous silicon film between the source and drain electrodes into an insulating film by a plasma processing, in lieu of the removal of the same portion by etching.

Alternatively, in the step shown in FIG. 1D, it may be possible to remove the very thin unnecessary portion of the n-type amorphous silicon film when the patterning of the source and drain electrodes is performed by dry etching. In such case, it is possible to reduce the number of fabrication steps since there is no need of the final step, that is, the removal of the unnecessary portion of the n-type amorphous silicon film by etching or the plasma processing.

In the thin film transistor fabricated according to this embodiment, a preferable switching characteristics of on/off resistance ratio not smaller than 6 powers and field effect mobility in the order of 0.7 $cm^2V^{-1}s^{-1}$ is obtained.

This means that, by using the method and apparatus for fabricating a semiconductor device according to the present invention, it is possible to obtain a preferable ohmic contact in the source and drain regions without necessity of separately forming the n-type amorphous silicon film to thereby fabricate a thin film transistor having characteristics suitable for use as a switching element of a liquid crystal display.

As the second embodiment of the present invention, a method for fabricating a reverse-staggered type thin film transistor through the steps shown in FIGS. 2A to 2E will be described.

First, a 100 nm thick, metal film of chromium was formed on a whole surface of a substrate 1 formed of a transparent insulating glass material by sputtering and a gate electrode 2 was formed by patterning the metal film to a desired shape by using wet etching.

Then, the substrate 1 was heated to 300° C. and, on the heated substrate 1, a 400 nm thick, silicon nitride film 3 was formed as a gate insulating film by plasma CVD with using a mixture gas of silane, ammonia and nitrogen as a material gas, as shown in FIG. 2A.

The formations of the gate electrode 2 and the silicon nitride film 3 were performed in the gate insulating film forming chamber 14 of the fabrication apparatus shown in FIG. 4A or 4B.

Thereafter, the glass substrate 1 was transported into the amorphous silicon film forming chamber 15 and a 100 nm thick, amorphous silicon film 4 was formed as an active layer by plasma CVD with using a mixture gas of silane and hydrogen as a material gas.

Thereafter, the glass substrate 1 was transported into the phosphine plasma processing chamber 11 and phosphor 6 was deposited on a surface portion of the amorphous as shown in FIG. 2B. The substrate 1 was kept at 250° C. during the phosphine plasma processing and hydrogen 0.5% phosphine gas was used as a material gas.

After that, the glass substrate 1 is exposed to the atmosphere, and then, the glass substrate 1 was transported into the metal film forming chamber 12 and a 100 nm thick, chromium film 7a for the source and drain electrodes was formed on the substrate 1 kept at 250° C. by sputtering, while keeping reduced pressure condition, as shown in FIG. 2C. At this time, an n-type amorphous silicon film having thickness of about several nanometers was automatically formed between the amorphous silicon film 4 and the chromium film 7a.

Thereafter, the chromium film 7a was patterned to a desired shape to form the source and drain electrodes 7. Further, the n-type amorphous silicon film 8 and the amorphous silicon film 4 were patterned to a desired island configuration, as shown in FIG. 2D.

Finally, an unnecessary portion of the n-type amorphous silicon film between the source and drain electrodes was removed by etching, resulting in the thin film transistor shown in FIG. 2E. Similarly to the case of the first embodiment, the n-type amorphous silicon film 8 formed by this embodiment is as thin as in the order of several nanometers. Therefore, it may be possible to fabricate the thin film transistor by converting the unnecessary portion of the n-type amorphous silicon film between the source and drain electrodes into an insulating film by a plasma processing, in lieu of the removal of the same portion by etching.

Alternatively, in the step shown in FIG. 2D, it may be possible to remove the very thin unnecessary portion of the n-type amorphous silicon film simultaneously with the patterning of the source and drain electrodes performed by dry etching. In such case, the final step, that is, the removal of the unnecessary portion of the n-type amorphous silicon film by etching or the plasma processing becomes unnecessary. In the thin film transistor fabricated according to this embodiment, a preferable switching characteristics of on/off resistance ratio not smaller than 6 powers and field effect mobility in the order of 0.8 $cm^2V^{-1}s^{-1}$ is obtained as in the first embodiment.

The foregoing switching characteristics are also obtained even in the case of without exposing the substrate to the atmosphere prior to the metal forming process after the phosphine plasma processing.

This means that, by using the method and apparatus for fabricating a semiconductor device according to the present invention, it is possible to obtain a preferable ohmic contact in the source and drain regions without necessity of separately forming the n-type amorphous silicon film to thereby fabricate a thin film transistor having characteristics suitable for use as a switching element of a liquid crystal display.

It is clear for those skilled in the art that the method and apparatus for fabricating the semiconductor device according to the present invention can be applied to other embodiments than the described embodiments, such as various reverse-staggered thin film transistors having different structures and thin film transistors using polycrystal silicon films other than the amorphous silicon film.

Further, the present invention can be applied to not only the thin film transistor but also all semiconductor devices having amorphous silicon/n-type amorphous silicon/metal junctions.

Further, phosphine gas based on not only hydrogen but also other gas such as argon gas or helium gas, etc., can be used in the phosphine plasma processing.

Further, although the formation of the metal film after the phosphine plasma processing has been described as performed by using sputtering, the metal film may be formed by other method such as vapor deposition than the sputtering.

Although the embodiments which use chromium as the material of the gate electrode and the source and drain electrodes have been described, it is of course possible to use other metal such as molybdenum, aluminum, tantalum or alloys of them or laminations of these metals.

As described hereinbefore, according to the present invention, it becomes possible to automatically form the n-type amorphous silicon film in the source and drain regions by successively performing the phosphine plasma processing and the formation of the metal film for the source and drain electrodes, after the formation of the amorphous silicon film, while keeping the reduced pressure condition.

Further, by utilizing the present invention, the number of film forming steps can be reduced, so that it is possible to improve the yield of thin film transistor fabrication.

Further, since the plasma CVD device and the metal film forming device such as sputtering device are connected each other to successively perform the respective processes, an improvement of the throughput can be realized.

Since the n-type amorphous silicon film automatically formed by the present invention is very thin, it is possible to fabricate a thin film transistor by not removing but converting the unnecessary portion thereof between the source and drain electrodes into an insulating film by plasma processing.

Further, according to the present invention, it is possible to remove the unnecessary portion of the n-type amorphous silicon film between the source and drain electrodes simultaneously with the patterning of the metal film for forming the source and drain electrodes by using dry etching. In such case, the final step, that is, the removal of the unnecessary portion of the n-type amorphous silicon film by etching or the plasma processing becomes unnecessary, realizing the reduction of the number of fabrication steps.

As mentioned above, the yield and throughput of reverse-staggered thin film transistor fabricated according to the present invention are substantially improved, so that it is realized to reduce the cost of the liquid crystal display.

What is claimed is:

1. A method for fabricating a semiconductor device, comprising the steps of:
    a first step of forming an amorphous silicon film on a substrate; and
    a second step of performing plasma processing with respect to said substrate having said amorphous silicon film formed thereon, said plasma containing an n-type impurity element selected from a group V of a periodic table to provide an n-type region in the top surface of the amorphous silicon film; and
    then directly
    a third step of forming a metal film on said amorphous silicon film to form an n-type amorphous silicon film therebetween.

2. A method for fabricating a semiconductor device, as claimed in claim 1, wherein said second step is performed successively after said first step without exposing said substrate to an oxidizing atmosphere first step.

3. A method for fabricating a semiconductor device, as claimed in claim 1, wherein said third step is performed successively after said second step without exposing said substrate to an oxidizing atmosphere.

4. A method for fabricating a semiconductor device, as claimed in claim 1, wherein said second step and said third step are performed successively after said first step and said second step, respectively, without exposing said substrate to an oxidizing atmosphere.

5. A method for fabricating a semiconductor device, as claimed in claim 1, wherein said impurity element is a phosphor to perform phosphine plasma process for said plasma processing.

6. A method for fabricating a semiconductor device, as claimed in claim 5, further comprising, before said first step, the steps of:
    forming a gate electrode on said substrate; and
    forming an insulating film covering said gate electrode, wherein said phosphine plasma processing is performed under a reduced pressure condition.

7. A method for fabricating a semiconductor device, as claimed in claim 6, further comprising the steps of:
    patterning said metal film to provide source and drain electrodes; and
    patterning said amorphous silicon film to provide an active region after said patterning said metal film.

8. A method for fabricating a semiconductor device, as claimed in claim 6, further comprising the steps of:
   patterning said amorphous silicon film to provide an active region; and
   patterning said metal film to provide source and drain electrodes.

9. A method for fabricating a semiconductor device, as claimed in claim 6, further comprising the step of patterning said metal film to provide source and drain electrodes of a thin film transistor, wherein a surface of said amorphous silicon film is turned into an n-type amorphous silicon region.

10. A method for fabricating a semiconductor device, as claimed in claim 9, further comprising the step of removing an unnecessary portion of said n-type amorphous silicon region between said source and drain electrodes.

11. A method for fabricating a semiconductor device, as claimed in claim 10, further comprising the step of performing the removing step by patterning said metal film.

12. A method for fabricating a semiconductor device, as claimed in claim 9, further comprising the step of converting an unnecessary portion of said n-type amorphous silicon region between said source and drain electrodes into an insulating region by performing another plasma processing using a gas selected from oxygen and nitrogen with respect to said unnecessary portion.

13. A method of fabricating a semiconductor device, comprising the steps of:
   a first step of forming an amorphous silicon film on a substrate;
   a second step of performing a plasma processing with respect to said substrate having said amorphous silicon film formed thereon, said plasma containing an n-type impurity element selected from a group V of the periodic table to provide an n-type region in the top surface of the amorphous silicon film; and
   a third step of forming a metal film on said amorphous silicon film;
   wherein at least one of said second and third steps are performed successively after the previous step and without exposing said substrate to an oxidizing atmosphere in the successive steps.

14. A method of fabricating a semiconductor device, as claimed in claims 13, further comprising, the steps of:
   forming a gate electrode on said substrate before said first step;
   forming an insulating film covering said gate electrode before said first step;
   patterning said electrode layer to provide source and drain electrodes; and
   removing an unnecessary portion of said n-type amorphous silicon region between said source and drain electrodes.

15. A method of fabricating a semiconductor device, as claimed in claim 14, wherein said unnecessary portion is removed by using the step of said patterning said electrode layer.

16. A method of fabricating a semiconductor device, as claimed in claim 13, further comprising, the steps of:
   forming a gate electrode on said substrate before said first step;
   forming an insulating film covering said gate electrode before said first step;
   patterning said electrode layer to provide source and drain electrodes; and
   converting an unnecessary portion of said n-type amorphous silicon region between said source and drain electrodes into an insulating region.

17. A method of fabricating a semiconductor device, comprising the steps of:
   a first step of forming a non-doped amorphous silicon film on a substrate;
   a second step of performing a plasma processing with respect to said amorphous silicon film formed on said substrate, said plasma containing an n-type impurity element selected from a group V of the periodic table to provide an n-type region in the top surface of the amorphous silicon film; and
   then directly
   a third step of forming an electrode layer on said amorphous silicon film to diffuse said impurity element into a surface portion of said amorphous silicon film so that an n-type amorphous silicon film is automatically formed between said electrode layer and said non-doped amorphous silicon film.

18. A method of fabricating a semiconductor device, as claimed in claim 17, further comprising, the steps of:
   forming a gate electrode on said substrate before said first step;
   forming an insulating film covering said gate electrode before said first step; and
   patterning said electrode layer to provide source and drain electrodes to form a thin film transistor.

19. A method of fabricating a semiconductor device, as claimed in claim 18, wherein an unnecessary portion of said n-type amorphous silicon film is removed by using the step of said patterning said electrode layer.

20. A method of fabricating a semiconductor device, as claimed in claim 17, wherein an unnecessary portion of said n-type amorphous silicon film between said source and drain electrodes is converted into an insulating film.

* * * * *